310-800 SR
1/29/80 XR 4,186,323

United States Patent [19]

[11] 4,186,323

[45] Jan. 29, 1980

Cragg et al.

[54] PIEZOELECTRIC HIGH POLYMER, MULTILAYER ELECTRO-ACOUSTIC TRANSDUCERS

[75] Inventors: William D. Cragg, Harlow; Anthony N. Lawson, London, both of England

[73] Assignee: International Standard Electric Corporation, New York, N.Y.

[21] Appl. No.: 833,849

[22] Filed: Sep. 16, 1977

[30] Foreign Application Priority Data

Sep. 21, 1976 [GB] United Kingdom ............... 39063/76

[51] Int. Cl.$^2$ ............................................. H01L 41/10

[52] U.S. Cl. ............................... 310/324; 179/110 A; 310/800

[58] Field of Search ............... 310/800, 322, 324, 334; 179/110 A

[56] References Cited

U.S. PATENT DOCUMENTS

| | | | |
|---|---|---|---|
| 3,816,774 | 6/1974 | Ohnuki et al. | 310/800 X |
| 3,832,580 | 8/1974 | Yamamuro et al. | 310/800 X |
| 3,947,644 | 3/1976 | Uchikawa | 310/800 X |

FOREIGN PATENT DOCUMENTS

| | | | |
|---|---|---|---|
| 2116573 | 10/1972 | Fed. Rep. of Germany | 179/110 A |

*Primary Examiner*—Mark O. Budd
*Attorney, Agent, or Firm*—John T. O'Halloran; Alfred C. Hill

[57] ABSTRACT

The present invention provides an electro-acoustic transducer including a pair of piezo-electric plastics film diaphragms coupled in a push-pull manner and so arranged as to form a lens-like configuration by a body of a light fibrous material therebetween.

The diaphragms are coupled in push-pull manner, and the transducer is especially suitable for use in a telephone instrument.

6 Claims, 8 Drawing Figures

PIEZOELECTRIC HIGH POLYMER, MULTILAYER ELECTRO-ACOUSTIC TRANSDUCERS

BACKGROUND OF THE INVENTION

1. Field of the Invention

This invention relates to electric acoustic transducers, and particularly to a transducer employing a piezo-electric polymer diaphragm as the active element.

2. Description of the Prior Art

A telephone subscriber's instrument usually employs a carbon microphone transmitter and a rocking armature electro-magnetic receiver. Whilst such a combination is satisfactory in operation the necessity of manufacturing two different types of transducer results in relatively high production costs. Furthermore both types of transducer must be made available for repairs and maintenance of the telephone equipment.

Piezo-electric plastics film has recently become available, and this film can be electrically polarised and provided with surface electrodes such that a change in the linear dimensions of the film induces a potential difference between the electrodes and vice versa. In particular, electrically polarised polyvinylidene fluoride (PVDF) film shows this property.

SUMMARY OF THE INVENTION

According to the invention there is provided an electro-acoustic transducer including a pair of piezo-electric plastics film diaphragms coupled in a push-pull manner and so as to form a lens configuration by a body of light fibrous material therebetween.

According to the invention there is further provided an electro-acoustic transducer including a piezo-electric plastics foil multilayer diaphragm assembly, in which the diaphragm has lenticular portions the two convex surfaces of which each comprise one or more layers of the plastics foil, in which each said layer has surface electrodes, the material of the foils being electrically polarised so that movement of the diaphragm generates potential differences between the electrodes of each of the foils, and vice-versa, and in which the electrodes of the layers of the two surfaces are coupled so that the two sets of foils operate in a push-pull manner.

Embodiments of the invention will now be described with reference to the accompanying drawings in which:

DESCRIPTION OF THE PREFERRED EMBODIMENT

Figure 1:
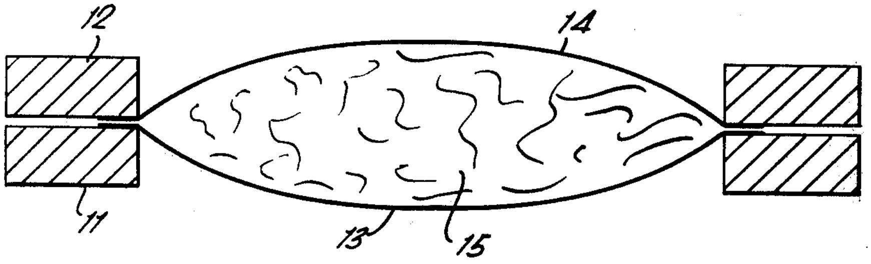
FIG. 1 is a cross section of a piezo-electric transducer assembly embodying the invention.
Figure 2:
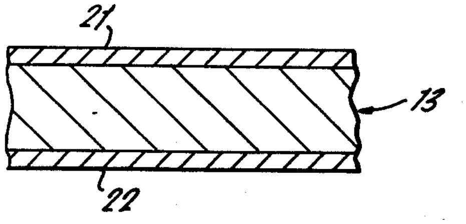
FIG. 2 is an enlarged cross-section of part of the diaphragm of the transducer of FIG. 1.

Referring to FIGS. 1 and 2, the transducer assembly includes a pair of annular baffle members 11 and 12 having a pair of piezo-electric plastics diaphragms 13 and 14 clamped therebetween. The diaphragms are electrically polarised so that they are in a 'back to back' configuration and are stretched into a lenticular form by a body 15 of light fibrous material trapped between the diaphragms 13 and 14. This diaphragm can conveniently be rectangular in plan, although in other cases, e.g. when used in a telephone instrument, it could be circular. The filling 15 is preferably synthetic fibre monofilament material.

As shown in FIG. 2, each plastics diaphragm is provided with electrodes 21 and 22 which electrodes are interconnected such that the diaphragm operate in a push-pull manner to maximise their output. Application of an alternating voltage to the electrode causes the diaphragms to expand and contract so as to generate a corresponding audio signal. Conversely, vibration of the diaphragm by an audio signal causes the generation of a corresponding alternating voltage.

The above arrangement is intended specifically for use as a microphone, in which case it is useful to reduce the acoustic impedance of the diaphragm to a value comparable with the free-air load impedance. When a head receiver is to be considered, the acoustical load impedance to be taken into account is that of the ear which is several orders of magnitude higher than that of free air. There is then a mechanical advantage in increasing the acoustical impedance of the transducers, and this is achieved in the manner shown in FIG. 3.

Figure 3:
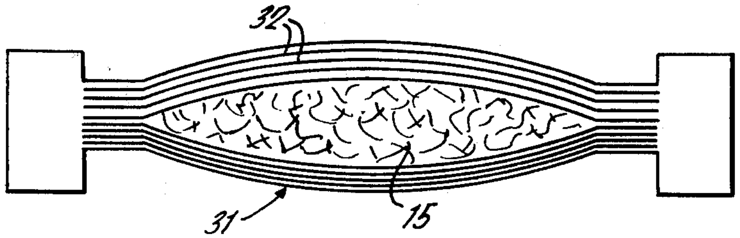
FIG. 3 shows a multilayer diaphragm construction embodying the invention.

FIG. 3 shows a high output diaphragm arrangement in which each lenticular shell 31 of the diaphragm assembly comprises successive layers 32 of piezo-electric plastics film each provided with electrodes (not shown) and interconnected so that the layers of each shell operate in unison, the two shells operating in push-pull manner. Each shell may have as many as ten layers, the layers being separated by thin layers of air, which are equivalant acoustically rigid couplings of the axial movements of individual diaphragms.

Figure 4:
FIG. 4 shows a multi-lenticellular diaphragm construction embodying the invention.

An alternative construction is shown in FIG. 4 in cross-section through the diaphragm. In this embodiment the diaphragm 41 is formed from a sheet of PVDF pressed into an overall part-spherical form and additionally is further formed into a number of small part-spherical cells, 42. Each small cell moves individually as a unit up to the higher telephonic frequencies of about 3 kHz and the multiplicity of small cells moves as a whole by the stiffening of the diaphragm into an overall part-spherical curvature. The PVDF is polarised to be piezo-electric, and electrodes are applied to each side of the whole diaphragm.

Figure 5:
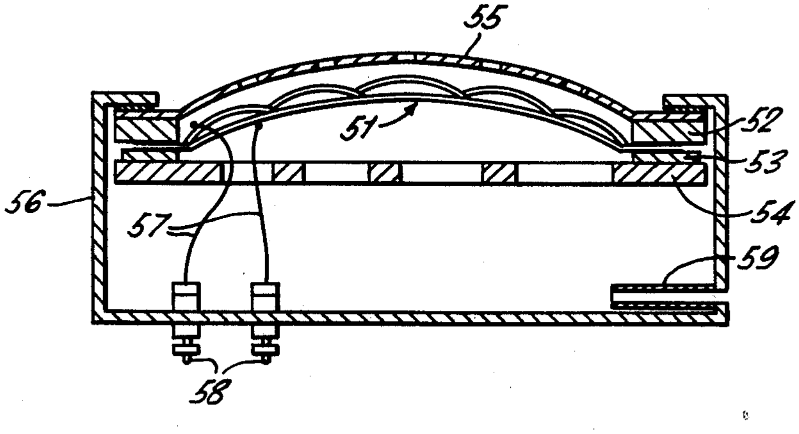
FIG. 5 is a cross-section of a transducer employing the diaphragm construction of FIG. 4.

FIG. 5 shows a transducer fitted with a multi-spherical diaphragm of the type shown in FIG. 4. The diaphragm 51 includes a diaphragm of the type shown in FIG. 4 with a simple-part-spherical diaphragm, and the whole is clamped between a pair of annular baffle members 52 and 53. These are mounted between a perforated mounting plate 54 and a perforated front cover 55 in a plastics housing 56. Conductive leads 57 couple the diaphragm electrodes to terminals 58 in the housing. A pressure equalising tube 59 may also be provided through the housing wall. In a preferred embodiment the individual cells of the diaphragm are approximately 5 mm in diameter and the whole diaphragm is moulded from 10 micron thick PVDF film.

Such a diaphragm arrangement can be used in the manner shown in FIG. 1, i.e. with a "filling" of the fibrous material.

Figure 6:
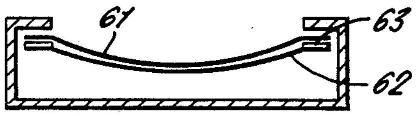
FIGS. 6 and 7 are cross-section and plan views respectively of a transducer intended for use as a telephone receiver.
Figure 7:
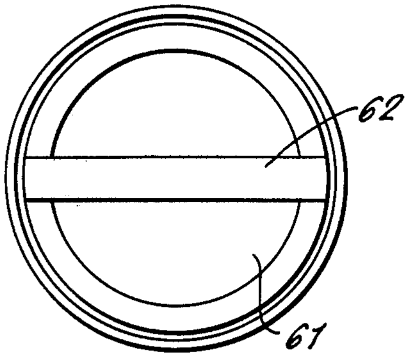

FIGS. 6 and 7 show a transducer arrangement intended for use as a telephone receiver. In this arrangement the capacitance of the configuration of FIG. 1 has been reduced with little or no loss of electro-acoustic efficiency. The domed diaphragm 61 is passive and may be made from a polycarbonate or unplasticised PVC. A rectangular flat strip 62 of PVDF material is mounted on an annular ring 63. After assembly the strip 62 is bowed by the curvature of the dome 61. The contact between the diaphragm dome 61 and the strip 62 stretches the latter slightly. On application of a signal voltage to the electrodes (not shown) of the PVDF strip 62, one polarity increases the length of the strip relaxing the force on the diaphragm 61 while the opposite polarity decreases the length increasing the force on the diaphragm.

Figure 8:
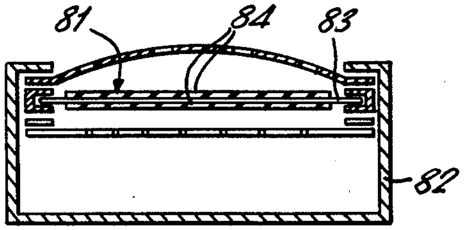
FIG. 8 is a cross-section of a transducer fitted with a composite diaphragm.

FIG. 8 shows a transducer fitted with a sandwich type diaphragm. The planar diaphragm assembly 81 is mounted in a housing 82 and includes an expanded polystyrene or microporous polypropylene sheet 83 to each face of which a layer 84 of PVDF material is bonded, e.g. by an adhesive. The PVDF layers 84 are oppositely polarised so that they operate in push-pull manner to bow the diaphragm when a signal is applied.

What is claimed is:

1. An electro-acoustic transducer comprising:

a pair of piezo-electric plastic foil diaphragms having lenticular portions, each of said diaphragms including a plurality of spaced layers of said plastic foil; and a separate surface electrode disposed on each surface of each of said plurality of layers, each of said plurality of layers being electrically polarized such that the movement of said pair of diaphragms generates a potential difference between said surface electrodes of each of said plurality of layers and the application of an alternating voltage to said surface electrodes causes said pair of diaphragms to vibrate; and said surface electrodes are interconnected such that said pair of diaphragms operate in a push-pull manner.

2. A transducer according to claim 1, wherein at least one of said pair of diaphragms is of part-spherical form having a plurality of small separate part-spherical cells.

3. A transducer according to claim 2, wherein the other of said pair of diaphragms is of only a part-spherical form.

4. An electro-acoustic transducer comprising:

a pair of piezo-electric plastic material diaphragms, one of said pair of diaphragms being bowed into a part-spherical form and including a plurality of separate part-spherical cells, said cells being convex in the same direction as the bow of said part-spherical form, and said other of said pair of diaphragms being bowed into a part-spherical form but without any of said cells and disposed substantially parallel to said one of said pair of diaphragms;

a surface electrode disposed on each surface of each of said pair of diaphragms, each of said pair of diaphragms being electrically polarized such that the movement of said pair of diaphragms generates a potential difference between said surface electrodes and the application of an alternating voltage to said surface electrodes causes said pair of electrodes to vibrate; and said surface electrodes are interconnected such that said pairs of diaphragms operate in a push-pull manner.

5. A transducer according to claim 4, further comprising:

two rings between which said pair of electrodes are edge-clamped;

a perforated part-spherical front cover disposed adjacent and parallel to a front surface of said one of said pair of diaphragms; and a perforated back-plate disposed adjacent to a back surface of said other of said pair of diaphragms.

6. An electro-acoustic transducer comprising:

a pair of piezo-electric plastic diaphragms each having a plurality of spaced layers of plastic foil, each of said plurality of layers being polarized;

a separate surface electrode disposed on each surface of each of said plurality of layers such that movement of said pair of diaphragms generate a potential difference between said surface electrodes and the application of a potential difference to said surface electrodes causes said pair of diaphragms to vibrate;

means for mounting said pair of diaphragms such that said pair of diaphragms are bowed away from each other to form a lens like arrangement and for operation electrically in a push-pull manner; and fibrous material means disposed between said pair of diaphragms.

* * * * *